Dec. 16, 1969 G. J. GILBERT 3,484,309
SEMICONDUCTOR DEVICE WITH A PORTION HAVING
A VARYING LATERAL RESISTIVITY
Filed Nov. 9, 1964

INVENTOR.
GEORGE J. GILBERT
BY Robert O. Vidas
ATTORNEY

United States Patent Office 3,484,309

Patented Dec. 16, 1969

3,484,309

SEMICONDUCTOR DEVICE WITH A PORTION HAVING A VARYING LATERAL RESISTIVITY

George J. Gilbert, Whitehouse Station, N.J., assignor, by mesne assignments, to Solitron Devices, Inc., a corporation of New York Filed Nov. 9, 1964, Ser. No. 409,702

Int. Cl. H01l *5/00*

U.S. Cl. 148—33.5 2 Claims

ABSTRACT OF THE DISCLOSURE

A semiconductor device has a non-planar P-N junction, including a diffused region adjacent the junction having a lower resistivity at its periphery than at its laterally central portion. This junction may serve as a diode junction or as the collector-base junction for a transistor. The diffused emitter of such a transistor is positioned to immediately overlie the higher resistivity central portion of the base.

The present invention relates to a semiconductor device and, more particularly, to an improved transistor with a low base resistance and a method of making the same.

In this specification, the terms "nonplanar" and "substantially planar" are used in connection with semiconductor P-N junctions. When so used, they refer to the major portion of the junction which lies generally parallel to the upper surface of a semiconductive wafer. The vertical portion of the junction at its outer periphery is ignored when referring to the junction as a whole as either "substantially planar" or "nonplanar." According to the above definition, a substantially planar P-N junction is one in which the entire junction interface, except the vertical periphery, lies in a single plane. The term "relatively low resistivity" is used in this specification to denote a doping level of the order of $10^{20}$ impurity atoms per cubic centimeter, whereas normal resistivity denotes a doping level of the order of $10^{18}$ impurity atoms per cubic centimeter.

The present invention provides a semiconductor device having a nonplanar P-N junction. A diffused region adjacent the junction has a lower resistivity at its lateral periphery than at its laterally central portion. The nonplanar P-N junction is formed by removing oxide from a portion of the surface of a first conductivity type oxided semiconductive wafer, depositing a coating containing opposite conductivity type impurity atoms on the exposed surface, diffusing a controlled number of the impurity atoms into the exposed wafer surface, etching away a portion of the coating to re-expose a central area of the surface, and diffusing additional impurity atoms into the unexposed wafer surface from the remaining coating. This junction may serve as a diode junction or as the collector-base junction for a transistor. The diffused emitter of such a transistor is positioned to immediately overlie the higher resistivity central portion of the base.

The method of the present invention results in a novel improved transistor exhibiting several advantages. First, the nonplanar interior region of the collector-base junction causes injection from the emitter to spread toward the center of the emitter because of a varying base width and a lower carrier concentration at the lateral center of the base. Second, the low resistivity peripheral portion of the base provides a device having a lower base resistance than prior art devices. Third, the current gain of the improved transistor peaks at higher currents since some injection occurs near the center of the emitter. Fourth, the current gain is higher at higher current levels than for prior art devices. Fifth, the improved device has a low base to emitter saturation voltage. Sixth, the device shows a higher secondary breakdown voltage than prior art devices.

Figure 1:
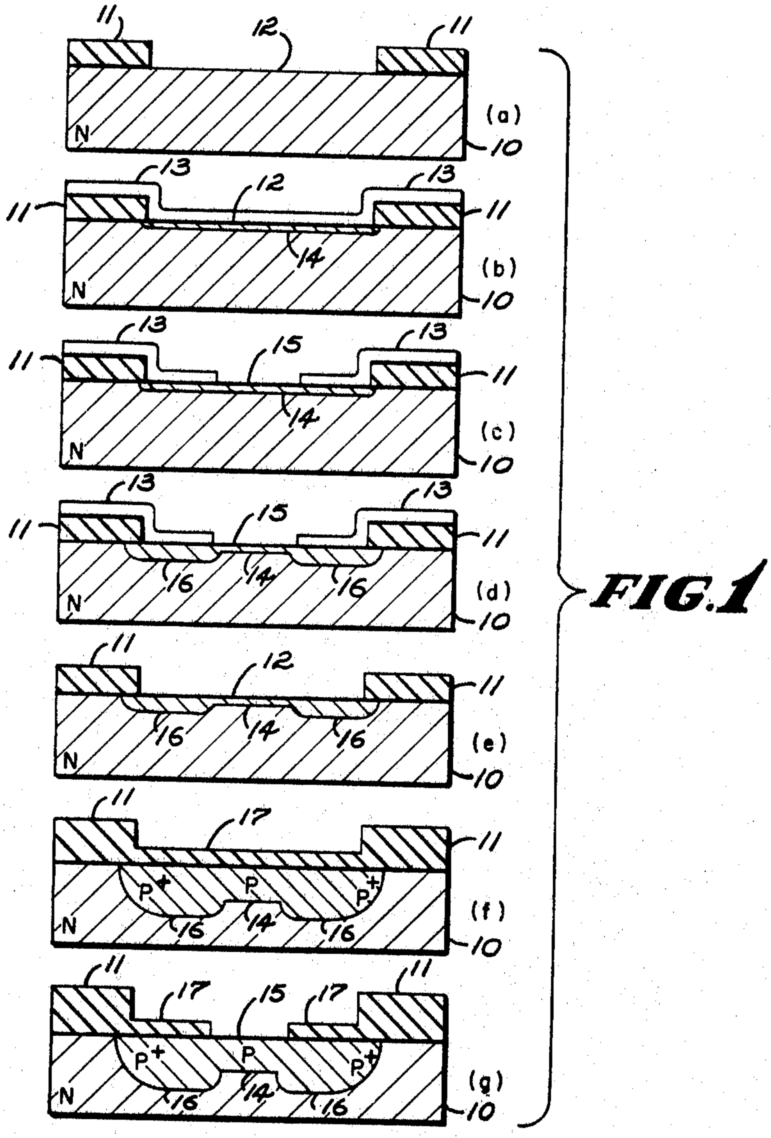
Figure 2:
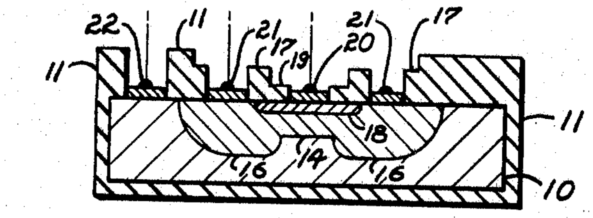

The present invention may be more fully understood when taken in connection with the following detailed description and drawings, wherein:

FIGURES 1(*a*)–(*g*) diagrammatically illustrate, in cross section, several steps in the production of devices containing a nonplanar P-N junction; and FIGURE 2 is a cross-sectional view of a transistor utilizing a nonplanar collector-base junction.

In the figures, the relative depth of the diffused regions has been greatly exaggerated for clarity. FIGURES 1(*a*)–(*d*) diagrammatically represent a wafer or block 10 of semiconductive material at various stages during the process of forming a nonplanar P-N junction. A wafer 10 of N type semiconductive material, which may be germanium or silicon, for example, is heated in an oxidizing atmosphere to grow an oxide coating 11 on the surface. Only the oxide on the upper surface has been shown for clarity. Photo etching techniques are used to remove a portion of oxide 11 to expose a surface area 12 of a region of wafer 10 as shown in FIGURE 1(*a*). A coating 13 contains P type impurity atoms is then deposited on surface area 12 as shown in FIGURE 1(*b*). The coating deposition is in accordance with techniques which are readily apparent to those skilled in the art. Either during deposition of coating 13, or immediately thereafter, wafer 10 is heated to a temperature sufficient to cause impurity atoms to diffuse shallowly into surface area 12 to form a limited P type source region 14. As shown in FIGURE 1(*c*), after formation of limited source 14, a portion of coating 13 is removed by selective photo etching to re-expose a reduced area 15 of the wafer surface. When the method is used for producing transistors, area 15 preferably has the same size, configuration, and position, as the exposed area for an emitter diffusion will occupy on a subsequent step. Additional P type impurity atoms are then diffused into the unexposed remainder of surface area 12 to form peripheral low resistivity P type source portion 16. Because of the additional P type impurity atoms present in peripheral portion 16, it extends deeper into wafer 10 than the remainder of region 14. The increase in impurity concentration at the surface of portion 16, by the addition of P type impurity atoms from unremoved coating 13, causes their diffusion rate to increase in portion 16 and accounts for the greater depth of portion 16. At this time during processing a nonplanar P-N junction has been formed in wafer 10.

FIGURES 1(*e*)–(*g*) diagrammatically illustrate additional steps utilized in the production of transistors having a nonplanar collector-base junction. The remainder of coating 13 is removed by selective etching techniques known to those skilled in the art as shown in FIGURE 1(*e*). FIGURE 1(*f*) shows wafer 10 after a deep diffusion and reoxidation step has been carried out. The wafer is heated to cause the P type impurities in regions 14 and 16 to diffuse deeper moving the P-N junction farther from the upper surface of wafer 10. Either simultaneously, or immediately thereafter, exposed area 12 is reoxidized with oxide layer 17. After reoxidation, an emitter pattern, substantially coextensive in area with the area of the pattern formed in the step illustrated in FIGURE 1(*c*), is etched through reformed oxide 17 to re-expose area 15 as shown in FIGURE 1(*g*). After re-exposing area 15, a transistor is formed utilizing techniques readily apparent to those skilled in the art. For example, sufficient N type impurity atoms may be diffused into wafer 10 through area 15 to form a relatively low resistivity emitter region. Area 15 may then be reoxidized either simultaneously with the diffusion, or after it. Holes may then be etched in the oxide to provide for ohmic contacts to the base, emitter, and collector. After this etching step, ohmic contacts may be deposited.

FIGURE 2 is a cross-sectional view of one modification of a transistor utilizing a nonplanar collector-base junction. An N type semiconductive block 10 forms the collector. A low resistivity laterally peripheral portion 16 of a P type base region surrounds an active central base portion 14. Preferably, a relatively low resistivity N type emitter 18 lies adjacent the upper surface of wafer 10 and immediately overlies portion 14. Emitter 18 need not have a relatively low resistivity and may have a lateral extent either slightly less than, exactly equal to, or slightly greater than the lateral extent of the higher resistivity portion 14 of the base. The exact surface pattern of region 14 and emitter 18 is a matter of choice and may be adapted to fit the use to which the transistor will be put. For example, the areas may be generally circular or generally rectangular with finger-like extensions. The surface of wafer 10 is covered by original oxide layer 11, a first regrown oxide layer 17, and a second regrown oxide layer 19. Ohmic contacts 20, 21, and 22, which may be of aluminum or any other suitable material, are made to the emitter, base, and collector regions respectively. As an alternate form, collector contact 22 may be connected on the lower surface of wafer 10, after removing oxide 11, rather than through the hole shown on the upper surface. Elements of groups III and V of the periodic table of elements provide, respectively, suitable P and N type impurity atoms for use in producing such transistors.

Transistors utilizing the present invention are useful in high frequency applications because of the reduced base resistance. Such transistors also have a peak current gain at higher levels than prior art transistors because of the varying base resistivity and varying base width.

EXAMPLE

The following example illustrates the preparation of a transistor according to the present invention. A single crystal chip of N type silicon was heated in an oxidizing atmosphere at a temperature of approximately 1200° C. for approximately two hours to form a silicon dioxide coating on the wafer surface. The wafer was cooled, masked with photo resist, and etched to cut away a portion of the oxide in the base pattern. The wafer was then heated to a temperature of approximately 900° C. in an atmosphere containing boron and oxygen. This resulted in creation of a borosilicate glass on the surface of the silicon dioxide and the exposed wafer. During this time, a number of boron atoms shallowly diffused into the exposed wafer surface. The wafer was then cooled, masked with photo resist, and etched in the emitter pattern to re-expose a portion of the wafer surface while leaving the borosilicate glass in contact with surrounding portions. The wafer was then reheated in an inert atmosphere to a temperature sufficient to cause diffusion of additional boron atoms into the wafer in the area still covered by the borosilicate glass. Next, the wafer was cooled and the remaining borosilicate glass was removed by selective etching. After that, the wafer was heated to a temperature of 1200° C. in an oxidizing atmosphere to cause the collector-base junction to diffuse more deeply into the wafer and to reoxidize the re-exposed wafer surface. The wafer was then cooled, remasked with the emitter pattern, and photo etched to again re-expose the wafer surface in the emitter pattern. Next, the wafer was heated to a temperature of about 950° C. in an atmosphere containing phosphorous and oxygen to form a phosphorosilicate glass over the exposed wafer surface. The temperature was then raised to approximately 1150° C. and the phosphorous supply shut off. The phosphorous diffusion was carried out at the above temperature for sufficient time to yield the desired emitter-base junction depth. Finally, ohmic contacts were made to the transistor in the normal manner.

Through the method and device of the present invention have been described in terms of a preferred embodiment, many modifications will be readily apparent to those skilled in the art. For example, the starting wafer may be of P type rather than N type, and the resulting transistor may be a PNP device rather than the NPN structure illustrated. Additionally, the transistor may be one of a number of transistors produced on a single chip for an integrated circuit; therefore, a single transistor need not utilize the parent material of the block as the collector. The collector may, instead, be a region diffused into, or epitaxially grown on, a block of opposite conductivity type material. It should be understood that the scope of this invention is limited only by the scope of the appended claims.

I claim:

1. A semiconductor device comprising:
a block of semiconductive material including a collector region of N type conductivity;
a base region of P type conductivity disposed within said collector region and including:
a first portion having a predetermined, area, depth and resistivity, and
a second portion completely surrounding the first portion along the depth thereof, the second portion having a substantially greater depth and lower resistivity than the first portion; and
an emitter of N type conductivity within the base region in an area substantially coextensive with the area of the first portion, the emitter having a depth substantially shallower than the first portion and having an impurity concentration of the order of $10^{20}$ impurity atoms per cubic centimeter.

2. A semiconductor device comprising:
a block of semiconductive material including a collector region of P type conductivity;
a base region of N type conductivity disposed within said collector region and including:
a first portion having a predetermined, area, depth and resistivity, and
a second portion completely surrounding the first portion along the depth thereof, the second portion having a substantially greater depth and lower resistivity than the first portion; and
an emitter of P type conductivity disposed within the base region in an area substantially coextensive with the area of the first portion, the emitter having a depth substantially shallower than the first portion and having an impurity concentration of the order of $10^{20}$ impurity atoms per cubic centimeter.

References Cited

UNITED STATES PATENTS 2,791,758 5/1957 Looney.
3,180,766 4/1965 Williams.
3,183,128 5/1965 Leistiko ____________ 148—33.5
3,183,129 5/1965 Tripp _______________ 148—33
3,243,669 3/1966 Chih Tang Sah.

HYLAND BIZOT, Primary Examiner

U.S. Cl. X.R.

148—186, 187